United States Patent
Komuro (10) Patent No.: US 6,384,377 B1
(45) Date of Patent: May 7, 2002

(54) AGING SOCKET, AGING CASSETTE AND AGING APPARATUS

(75) Inventor: Satoru Komuro, Miyagi (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/621,548

(22) Filed: Jul. 21, 2000

(30) Foreign Application Priority Data

Jul. 23, 1999 (JP) .......................................... 11-208577

(51) Int. Cl.[7] .............................................. G01R 31/26
(52) U.S. Cl. ...................... 219/209; 219/385; 324/158.1
(58) Field of Search ................................ 219/209, 521, 219/385, 201, 476, 478; 324/158.1

(56) References Cited

U.S. PATENT DOCUMENTS

| | | | | |
|---|---|---|---|---|
| 4,384,193 A | * | 5/1983 | Kledzik et al. | ............. 219/385 |
| 4,604,572 A | * | 8/1986 | Horiuchi et al. | ............ 324/760 |
| 4,739,258 A | * | 4/1988 | Schwarz | ...................... 324/537 |

FOREIGN PATENT DOCUMENTS

| | | | |
|---|---|---|---|
| JP | 61-269085 | * | 11/1986 |
| JP | 63-184078 | * | 7/1988 |
| JP | 64-83165 | * | 3/1989 |
| JP | 4-306583 | * | 10/1992 |
| JP | 5-36793 | * | 2/1993 |
| JP | 11-2655 | * | 1/1999 |

OTHER PUBLICATIONS

Hu, S.M., "Apparatus for High–Temperature Microindentation Studies", IBM Tech. Discl. Bulletin, vol. 17, No. 2, Jul. 1974.*

* cited by examiner

*Primary Examiner*—John A. Jeffery
(74) *Attorney, Agent, or Firm*—Ronald P. Kananen, Esq.; Rader, Fishman & Grauer, PLLC (57) ABSTRACT

The invention provides an aging socket, an aging cassette and an aging apparatus with which an aging system of a very low cost can be constructed and aging can be performed for any number of inspection object parts. The aging socket includes a base on which a mounting portion on which an imaging object part can be mounted is formed, and a heater and a temperature regulator incorporated in the base. A plurality of such aging sockets are disposed in a matrix on the aging cassette. One or a plurality of such cassettes on which such sockets are mounted are mounted in position into slots of the aging apparatus. Consequently, aging of any number of aging object parts mounted on the sockets of one or more cassettes can be performed by the aging apparatus.

13 Claims, 12 Drawing Sheets

AGING SOCKET, AGING CASSETTE AND AGING APPARATUS

BACKGROUND OF THE INVENTION

This invention relates to an aging socket and an aging cassette suitably applied to a small electronic part such as a semiconductor laser device and an aging device for performing aging for a small electronic part.

An aging socket, an aging cassette and an aging apparatus which are conventionally known are shown in FIGS. 7 to 13B.

Figure 7:
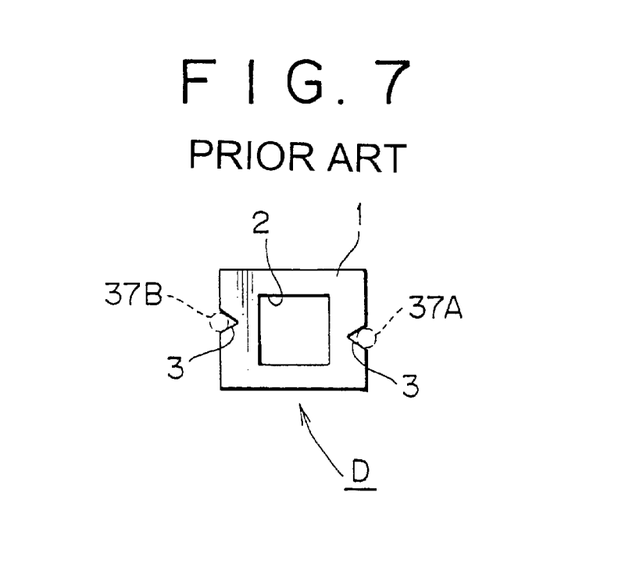
FIG. 7 is a top plan view schematically showing an example of a semiconductor laser coupler which is used popularly.

First, a semiconductor laser coupler which is one of aging object parts to be aged is described briefly with reference to FIG. 7.

The semiconductor laser coupler D shown is constructed such that a laser device body mounted on a circuit board is accommodated in a package 1 of a shape of a parallelepiped which has an opening 2 at a central portion of the top thereof while a pair of wedge-shaped notches 3 are formed in the middle of a pair of opposing sides thereof such that a laser beam is emitted from the opening 2 and then introduced into the opening 2 after it is reflected by a reflecting object so that some signals may be detected by the semiconductor laser coupler D.

Figure 8:
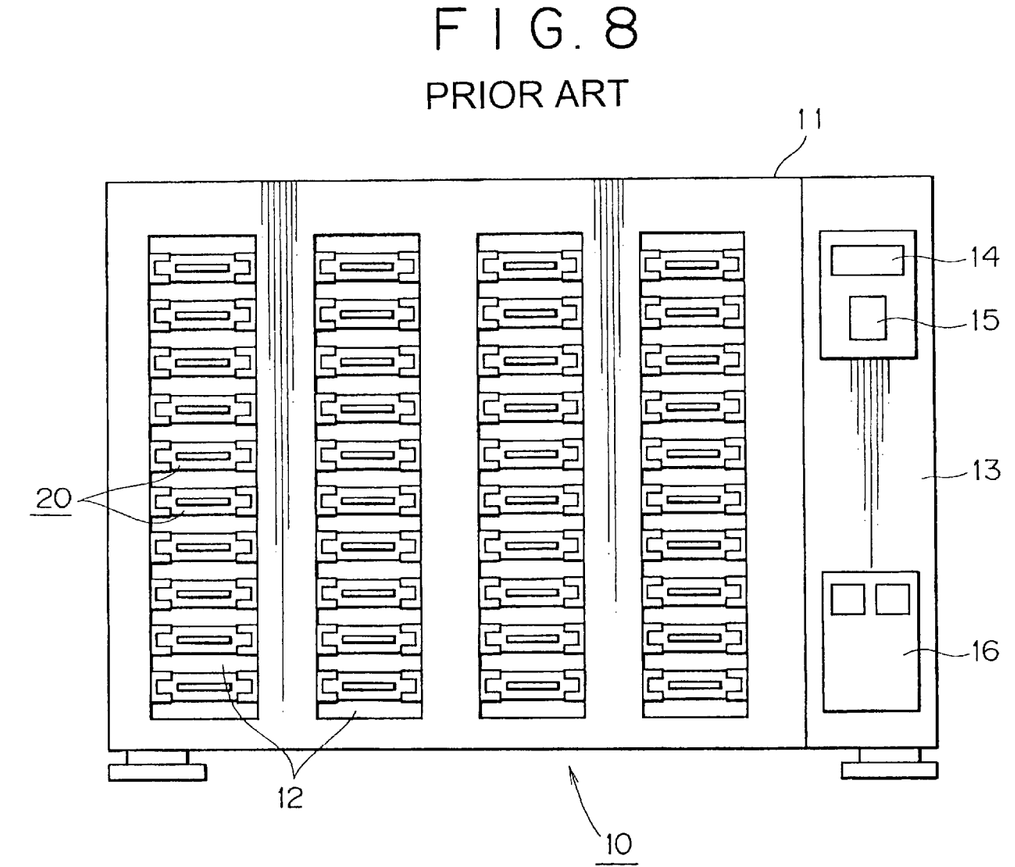
FIG. 8 is a front elevational view of a conventional aging apparatus.
Figure 9:
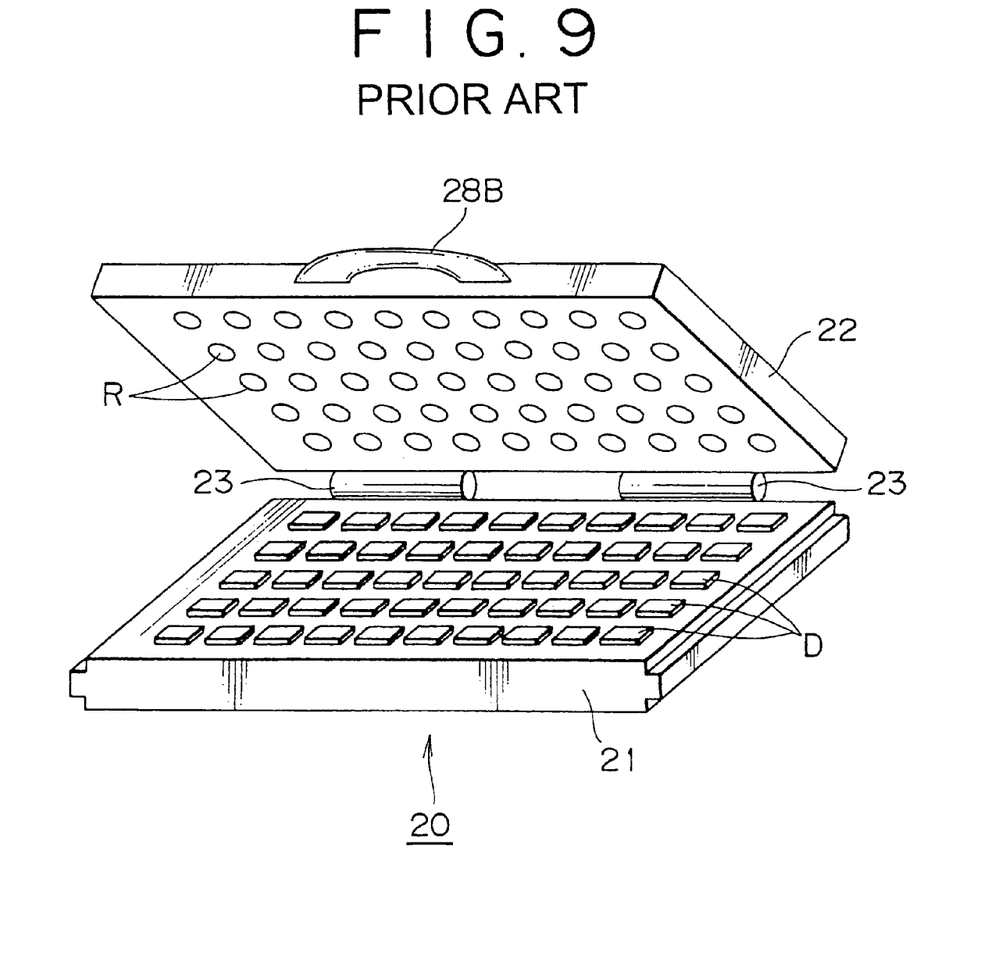
FIG. 9 is a perspective view showing an appearance of a conventional aging cassette.

An aging apparatus and an aging cassette are shown in FIGS. 8 and 9, respectively. Referring to FIGS. 8 and 9, the aging cassette (hereinafter referred to merely as "cassette") 20 and the aging apparatus 10 are used such that the semiconductor laser coupler D as described above with reference to FIG. 7 is placed onto the cassette 20 and then the cassette 20 is placed onto the aging apparatus 10 and then heated to a temperature of 60° C. to 70° C. to evaluate a condition of deterioration of various characteristics of the semiconductor laser coupler D.

The aging apparatus 10 includes a housing 11 of a large size and has a constant temperature bath function of keeping the inside thereof constant at the temperature mentioned above. The inside of the aging apparatus 10 is partitioned like a matrix to form a plurality of slots 12 therein. Further, though not shown, a common heater and fan are built in the aging apparatus 10 such that hot air heated by the heater is blasted into the inside of the housing 11 to simultaneously heat all cassettes 20 accommodated in the slots 12 to a substantially equal temperature while the temperature is controlled so as to be fixed by a temperature regulator also which is built in the aging apparatus 10. Further, the aging apparatus 10 has a front panel section 13 on the right side in FIG. 8, and a temperature display apparatus 14 and a power supply switch 15 are provided at an upper portion of the front panel section 13. Further, a circuit breaker 16 and so forth are provided at a lower portion of the front panel section 13.

It is to be noted that, although, during aging of the aging apparatus 10, the front of the aging apparatus 10 is closed up with a door to keep the inside of the aging apparatus 10 at the constant temperature, in FIG. 8 the aging apparatus 10 is shown with the door removed. Further, in FIG. 8, the aging apparatus 10 is shown in a state wherein the cassette 20 shown in FIG. 9 is inserted in each of the slots 12 described above.

The cassette 20 is formed in such a structure as shown in FIGS. 9 to 12. Referring to FIGS. 9 to 12, the cassette 20 includes a body 21 and a lid member 22 connected to each other by a pair of hinges 23. The body 21 receives a plurality of semiconductor laser couplers D as aging object parts thereon, and the lid member 22 has a plurality of light receiving elements R, which each receives a laser beam, incorporated therein corresponding to the semiconductor laser couplers D.

While FIG. 9 shows the cassette 20 where semiconductor laser couplers D are mounted on the body 21, each of the semiconductor laser couplers D is received in a socket 30 shown in FIGS. 10 to 13B. Before the structure of the socket 30 is described, the structure of the cassette 20 is described. A plurality of sockets 30 are incorporated in an arrangement of a matrix on a face of the body 21 of the cassette 20 which opposes to the lid member 22. A power supply electrode, a ground electrode and a signal transmission/reception electrode are incorporated in each of the sockets 30, and the electrodes of the sockets 30 are connected to an electronic circuit board 24 disposed below the sockets 30. Part of the electronic circuit board 24 is led out toward the hinged side 23 of the cassette 20 and serves as a plug-in terminal 24A when the cassette 20 is inserted into a slot 12 of the aging apparatus 10.

Figure 10:
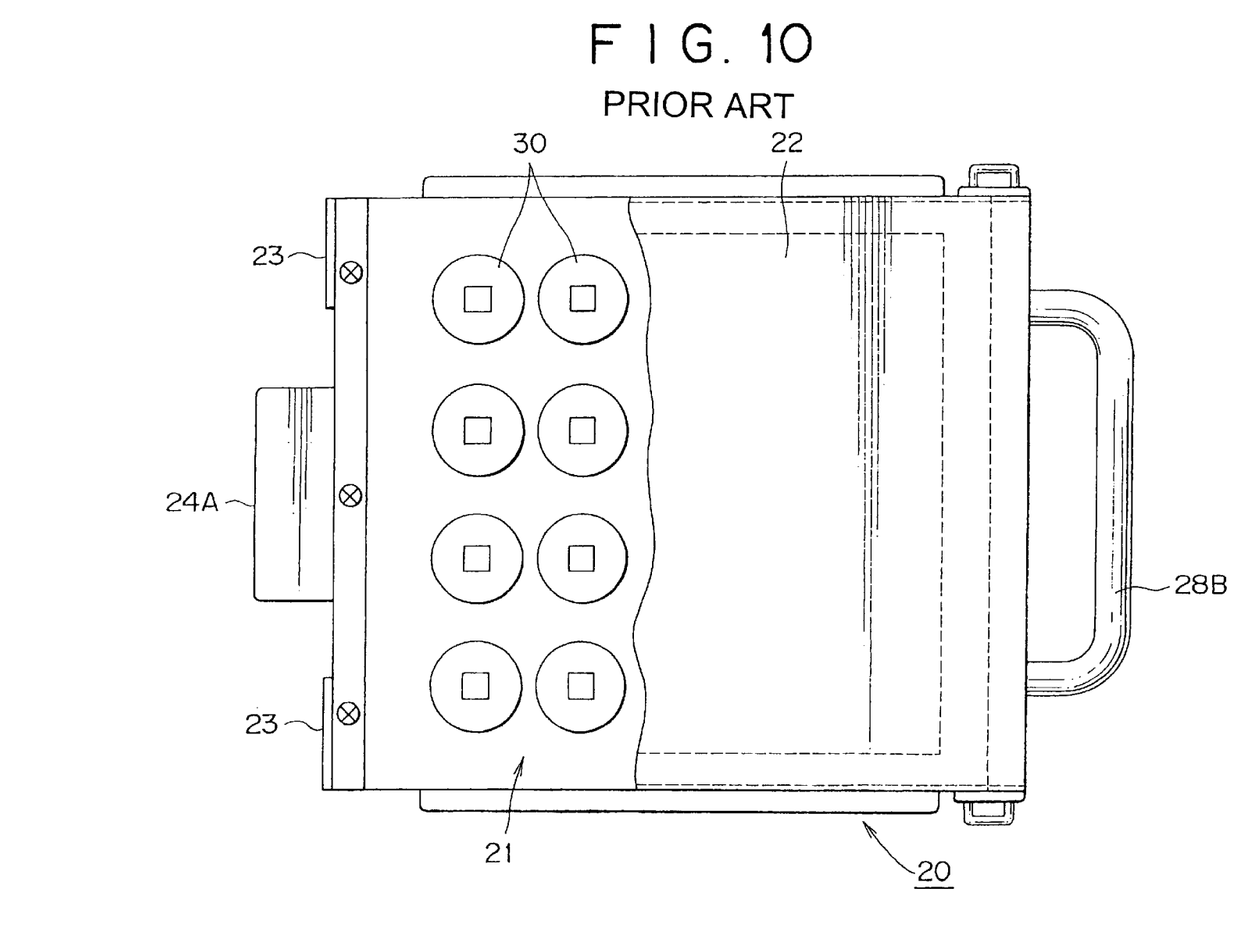
FIG. 10 is a top plan view showing the aging cassette shown in FIG. 9 with part of a lid member cut away.
Figure 11:
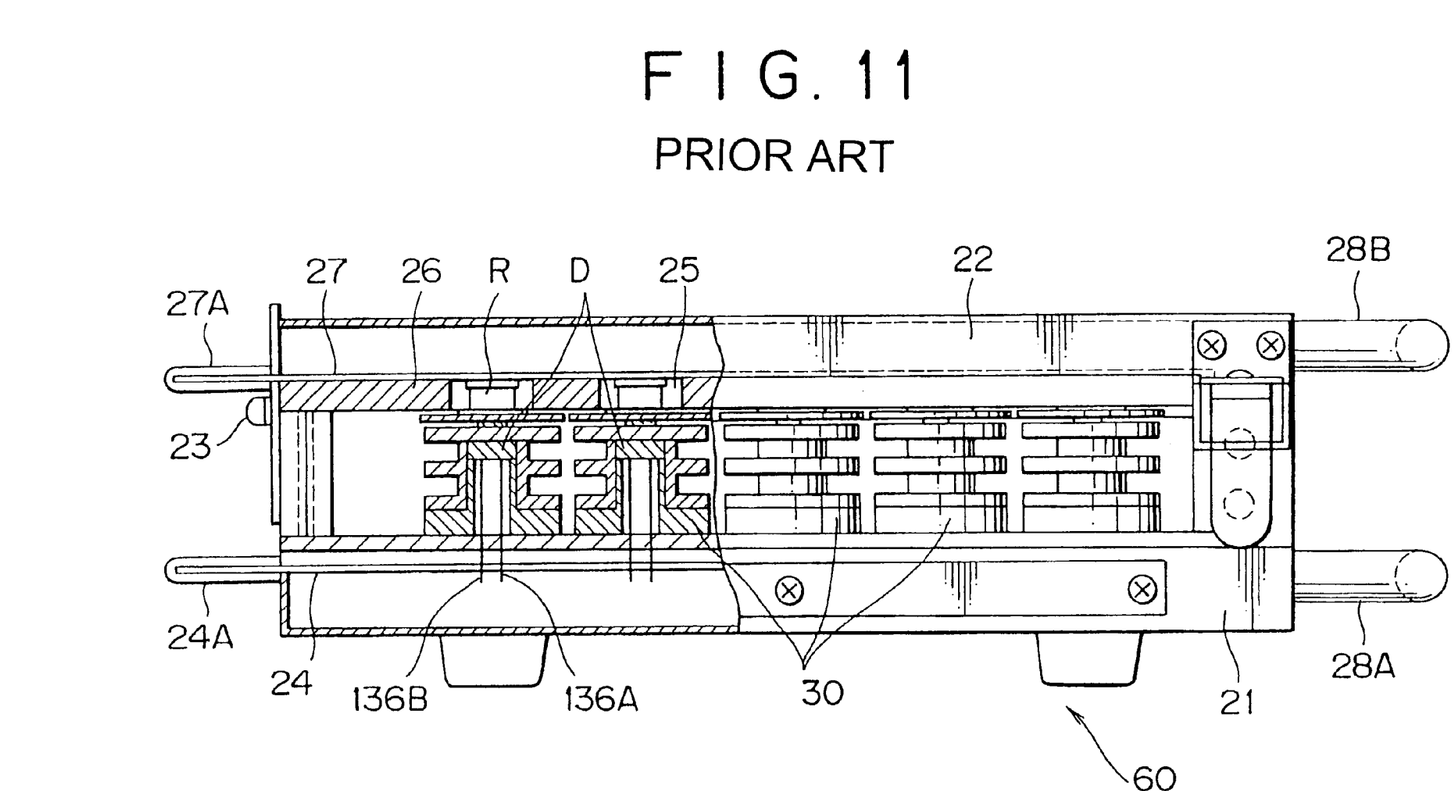
FIG. 11 is a side elevational view partly in section showing the aging cassette shown in FIG. 10 as viewed from an arrow A.
Figure 12:
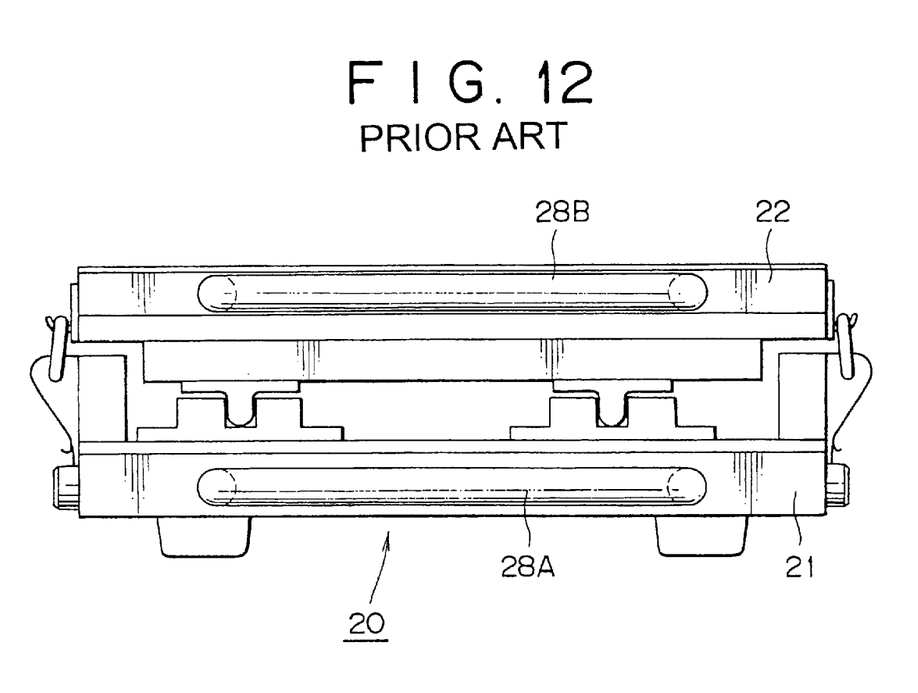
FIG. 12 is a side elevational view of the aging cassette shown in FIG. 10 as viewed from an arrow B.

Meanwhile, a plurality of circular holes 25 are formed at portions of a surface of the lid member 22 adjacent the body 21 in an opposing relationship to the sockets 30. Further, a hold down plate 26 is disposed on the surface of the lid member 22 adjacent the body 21 such that it can hold down the semiconductor laser couplers D when the lid member 22 is closed while the semiconductor laser couplers D are received in the socket 30, and the light receiving elements R are disposed in the circular holes 25. Also various electrodes of the light receiving elements R are connected to an electronic circuit of a electronic circuit board 27 disposed behind them. Part of the electronic circuit board 27 is led out to the hinged side 23 of the cassette 20 similarly and serves as another plug-in terminal 27A when the cassette 20 is inserted into a slot 12 of the aging apparatus 10.

A U-shaped handle 28A is mounted on an end face of the body 21 remote from the hinges 23, and another U-shaped handle 28B of an equal size is mounted on a corresponding end face of the lid member 22.

Figure 13A:
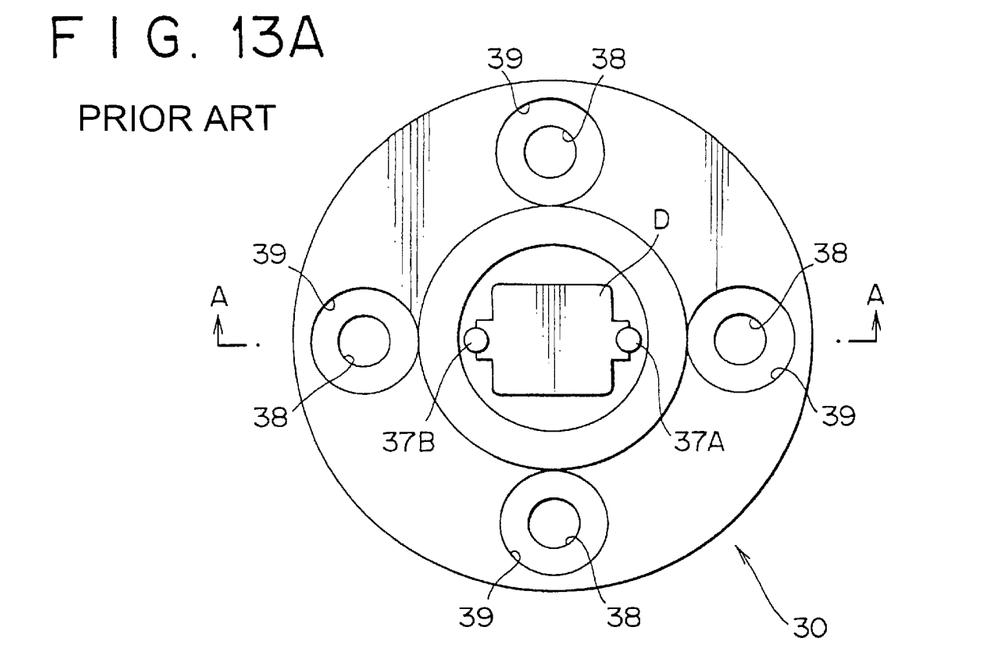
FIG. 13A is a top plan view showing a socket incorporated in the aging cassette shown in FIG. 9.
Figure 13B:
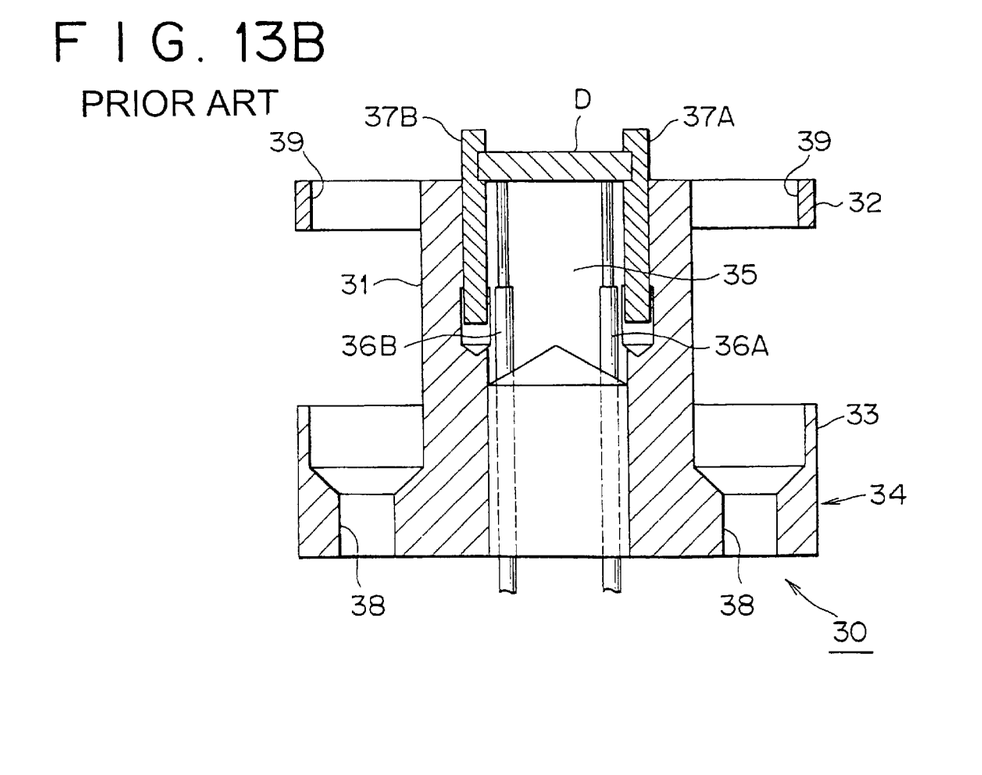
FIG. 13B is an enlarged sectional view taken along line A—A of FIG. 13A.

The socket 30 is particularly shown in FIGS. 13A and 13B. Referring to FIGS. 13A and 13B, the socket 30 has a cylindrical portion 31 of a comparatively great thickness at a central portion thereof. An upper flange 32 in the form of a disk having a comparatively small thickness is formed horizontally at an upper end of the cylindrical portion 31, and a mounting flange 33 in the form of a disk having a comparatively great thickness is formed horizontally at a lower end of the cylindrical portion 31. Consequently, the socket 30 is formed as a base 34 of a tubular structure having a U-shaped cross section. A pair of electrode pins 36A and 36B are positioned in an opposing relationship on an inner circumferential face of a hollow portion 35 of a horizontally circular section at a central portion of the base 34 and are led out downwardly of the base 34 from a receiving face of the base 34 for a semiconductor laser coupler D.

Further, a pair of positioning pins 37A and 37B are embedded in the base 34 such that they are held in contact with outer arcuate faces of the electrode pins 36A and 36B and extend upwardly a little above the top face of the base 34. The distance between inner arcuate faces of the positioning pins 37A and 37B is set corresponding to the distance between the pair of notches 3 formed on the package 1 for a semiconductor laser coupler D.

Four fixing screws 38 are formed in the mounting flange 33, and four through-holes 39 are formed in the upper flange 32 and positioned above the mounting flange 33. Thus, a screwdriver may be inserted in any of the through-holes 39 and screw a fixing screw into the fixing screw 38 to fasten the base 34 to a mounting member of the body 21 side. In FIGS. 13A and 13B, a semiconductor laser coupler D is shown mounted on the socket 30.

The conventional aging apparatus 10 and cassette 20 are constructed in such structures as described above. In order to perform aging of semiconductor laser couplers D using the aging apparatus 10 and the cassette 20, the lid member 22 of the cassette 20 is opened first, and a semiconductor laser coupler D is placed into each of the sockets 30 disposed on the body 21 of the cassette 20 such that the positioning pins 37A and 37B are inserted into the notches 3 of the semiconductor laser coupler D until the semiconductor laser coupler D is brought into contact with the electrode pins 36A and 36B.

Then, a large number of such cassettes 20 as described above on each of which a large number of semiconductor laser couplers D are mounted in such a manner as described above are inserted into the slots 12 of the aging apparatus 10 until the plug-in terminals 24A and 27A projecting from the cassettes 20 are fitted into sockets (not shown) mounted at interior portions of the slots 12 so that they are mounted in position. Then, the door (not shown) of the aging apparatus 10 is closed.

Thereafter, the power supply switch 15 of the aging apparatus 10 is turned on so that the inside of the aging apparatus 10 is heated until such a predetermined fixed temperature as described above is reached, and the inside of the aging apparatus 10 is regulated by the temperature regulators 13 so that the individual cassettes 20 may be kept at the predetermined fixed temperature.

Simultaneously, power is supplied to each of the semiconductor laser couplers D through the plug-in terminal 24A, and power is supplied also to the light receiving elements R corresponding to the semiconductor laser couplers D through the plug-in terminal 27A while data signals produced by the individual light receiving elements R from laser light received from the individually corresponding semiconductor laser couplers D are inputted from the plug-in terminal 27A to a computer (not shown) connected to the aging apparatus 10. Consequently, the computer processes the inputted data signals to detect and record characteristic variations of the individual semiconductor laser couplers D.

Such aging is performed to examine whether or not the individual semiconductor laser couplers D are good or whether or not semiconductor laser couplers D are good for each manufacture lot.

However, the aging apparatus 10 must produce a predetermined temperature profile after all cassettes 20 are set into it because the aging apparatus 10 itself functions as a constant temperature bath.

Further, the aging apparatus 10 itself is considerably large in size and is very high in price.

Furthermore, in the conventional aging apparatus 10, the body serving as a constant temperature bath is controlled using a single temperature regulator. Consequently, each aging operation must be performed with cassettes 20 received in all of the slots 12 of the aging apparatus 10. Accordingly, the operation efficiency is low.

SUMMARY OF THE INVENTION

It is an object of the present invention to provide an aging socket, an aging cassette and an aging apparatus with which an aging system of a very low cost can be constructed.

It is another object of the present invention to provide an aging socket, an aging cassette and an aging apparatus with which aging can be performed for any number of inspection object parts.

In order to attain the objects described above, according to an aspect of the present invention, there is provided an aging socket, including a base on which a mounting portion on which an aging object part can be mounted is formed, a heater for heating an aging object part mounted on the mounting portion, and a temperature sensor for detecting a temperature of the mounting portion, a temperature of an aging object part mounted on the mounting portion and being heated or a temperature of the heater, the heater and the temperature sensor being incorporated in the base in such a manner as to be opposed to the mounting portion.

With the aging socket, an aging object part mounted on the aging socket can be heated directly.

According to another aspect of the present invention, there is provided an aging cassette, including a body, a plurality of sockets disposed on the body and each including a base on which a mounting portion on which an aging object part can be mounted is formed, a heater for heating an aging object part mounted on the mounting portion, and a temperature sensor for detecting a temperature of the mounting portion, a temperature of an aging object part mounted on the mounting portion and being heated or a temperature of the heater, the heater and the temperature sensor being incorporated in the base in such a manner as to be opposed to the mounting portion, and an electronic circuit board built in the body and including a power supply circuit by which terminals of the heaters and the temperature sensors mounted on the sockets are connected to individual power supplies.

With the aging cassette, all of aging object parts mounted on the aging cassette can be heated all at the same time or for each group or else individually to perform aging of the same. Consequently, characteristic states of the individual aging object parts can be evaluated.

According to a further aspect of the present invention, there is provided an aging apparatus, including a body on which a plurality of slots each capable of receiving an aging cassette are formed, each of the aging cassettes having a body, a plurality of sockets disposed on the body and each including a socket body, a plurality of sockets disposed on the socket body of the socket and each including a base on which a mounting portion on which an aging object part can be mounted is formed, a heater for heating an aging object part mounted on the mounting portion, and a temperature sensor for detecting a temperature of the mounting portion, a temperature of an aging object part mounted on the mounting portion and being heated or a temperature of the heater, the heater and the temperature sensor being incorporated in the base in such a manner as to be opposed to the mounting portion, and an electronic circuit board built in the body and including a power supply circuit by which terminals of the heaters and the temperature sensors mounted on the sockets are connected to individual power supplies, and a start switch and a temperature regulator incorporated in each of the slots.

Preferably, the aging apparatus further comprises a temperature indicator incorporated in each of the slots.

With the aging apparatus, it need not be formed as a constant temperature bath, and consequently, it can be formed at a very low cost. Further, aging of any number of aging cassettes which are set in the slots of the aging apparatus can be started individually or for each group or else for all of them to effect temperature regulation. Accordingly, aging object parts can be evaluated individually, and aging can be performed irrespective of whether the quantity of aging object parts is great or small.

The above and other objects, features and advantages of the present invention will become apparent from the following description and the appended claims, taken in conjunction with the accompanying drawings in which like parts or elements denoted by like reference symbols.

DESCRIPTION OF THE PREFERRED EMBODIMENT

Figure 1:
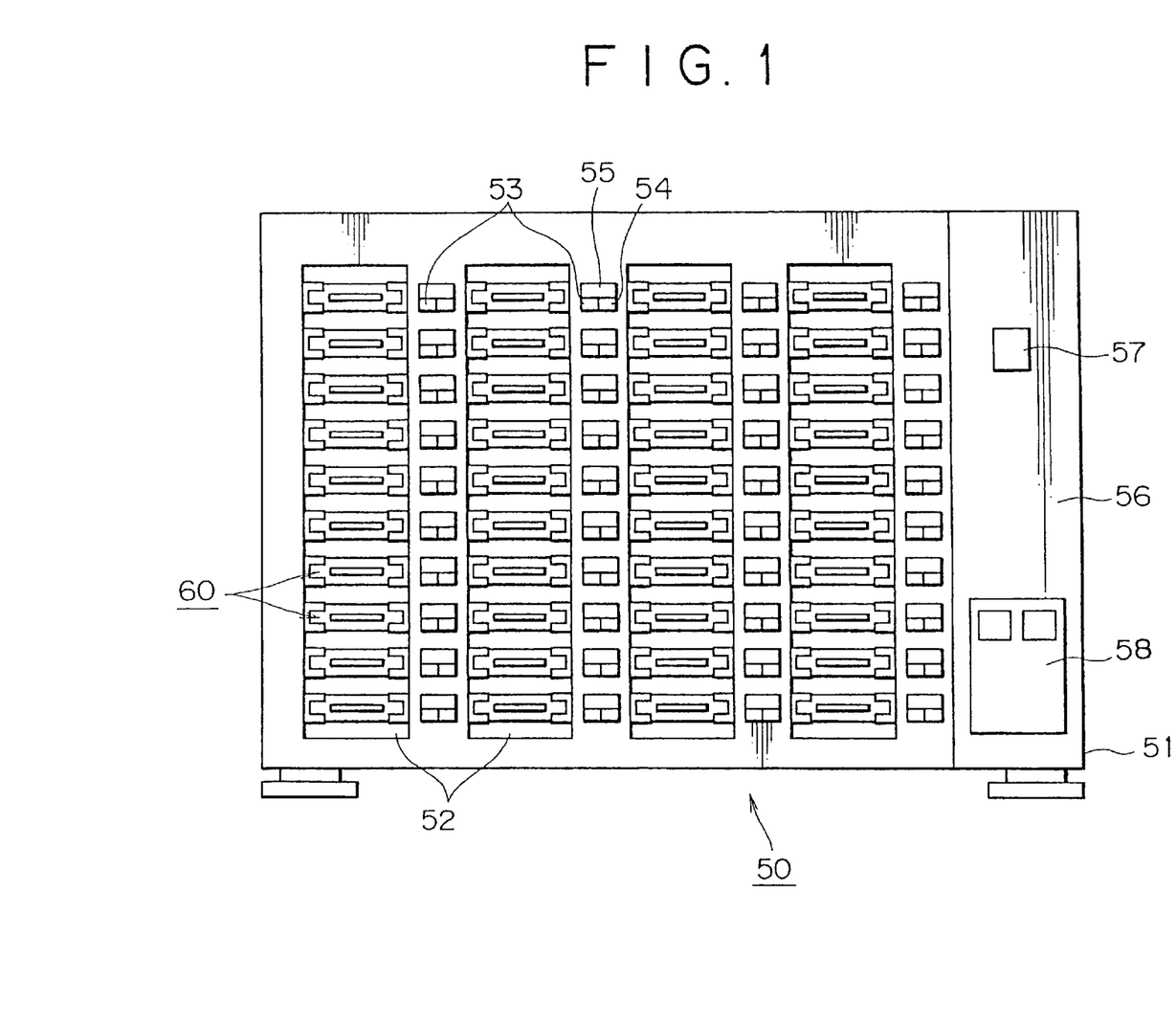
FIG. 1 is a front elevational view of an aging apparatus to which the present invention is applied.

Referring to FIG. 1, there is shown an aging apparatus to which the present invention is applied. The aging apparatus is generally denoted at 50 and includes a housing 51, the inside of which is partitioned in a matrix to form a plurality of slots 52. In the interior of each of the slots 52, a pair of sockets (not shown) into which two plug-in terminals of a cassette 60 which will be hereinafter described are inserted are provided. The sockets of the slots 52 are connected to a built-in or externally provided evaluation circuit (not shown) for supplying power to individual semiconductor laser couplers D mounted on bodies 61 of individual cassettes 60 and supplying power to individual light receiving elements R mounted on lid members 62 of the cassettes 60 and for evaluating states such as light emission characteristics of the semiconductor laser couplers D from signals generated from the light receiving elements R receiving laser beams emitted from the semiconductor laser couplers D.

The housing 51 has an opening formed on the right side in FIG. 1 of each of the slots 52. In each of the openings, a power supply switch 53 for supplying power to a cassette 60 inserted in the corresponding slot 52, a temperature regulator 54 for regulating the temperatures of semiconductor laser couplers D mounted in the individual sockets 30 of the cassette 60, and a monitor 55 are mounted on the surface of a front panel.

Further, a front panel section 56 is provided on a right portion in FIG. 1 of the housing 51, and a main power supply switch 57 is mounted at an upper portion of the front panel section 56 while a main circuit breaker 58 is mounted at a lower portion of the front panel section 56.

Similarly to the conventional aging apparatus 10 described hereinabove, the aging apparatus 50 includes a door (not shown) for closing the front of the aging apparatus 50 to keep the inside of the aging apparatus 50 at a constant temperature during aging. In FIG. 1, the aging apparatus 50 is shown with the door removed. Further, in FIG. 1, the aging apparatus 50 is shown with the cassette 60 of FIG. 2 inserted in each of the slots 52 thereof.

Now, a cassette to which the present invention is applied is described with reference to FIGS. 2 to 5. The cassette generally has a similar construction to that of the conventional cassette 20 described hereinabove, and like elements are denoted by like reference characters and overlapping description of them is omitted herein to avoid redundancy.

Figure 2:
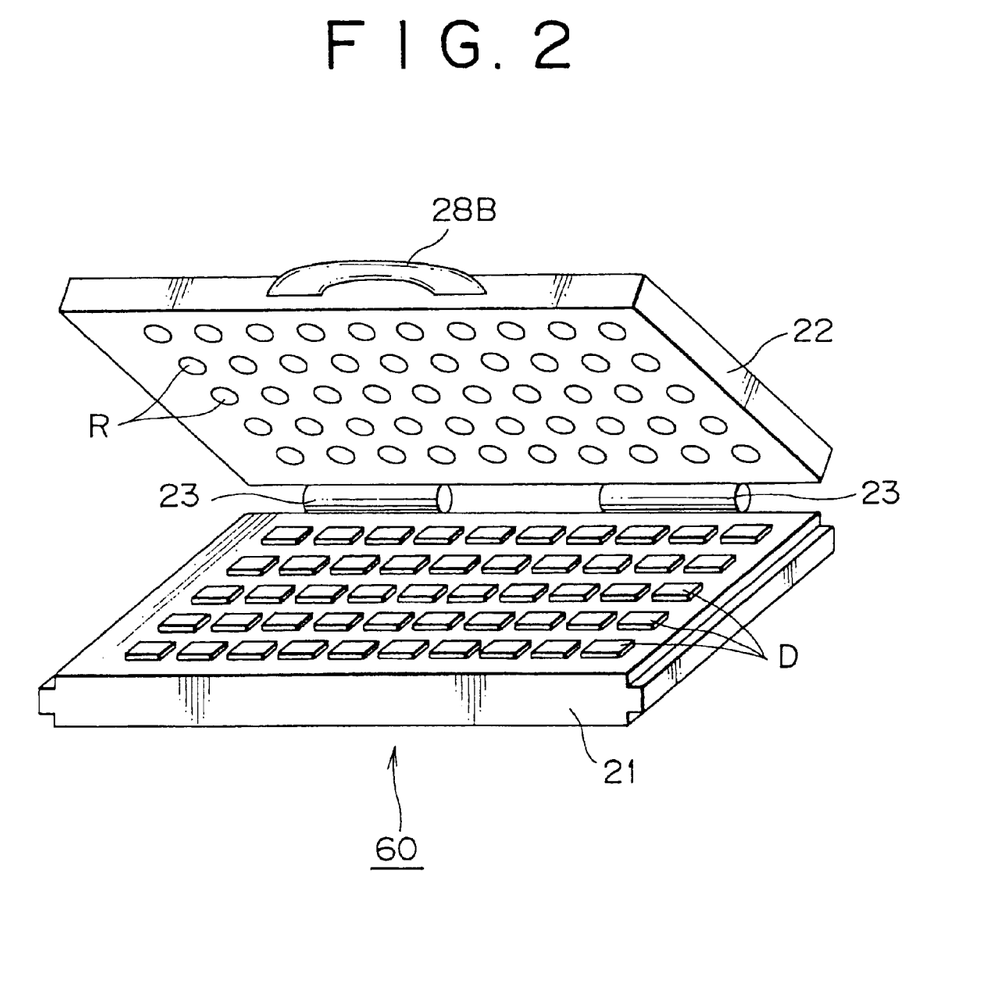
FIG. 2 is a perspective view showing an appearance of an aging cassette to which the present invention is applied.
Figure 3:
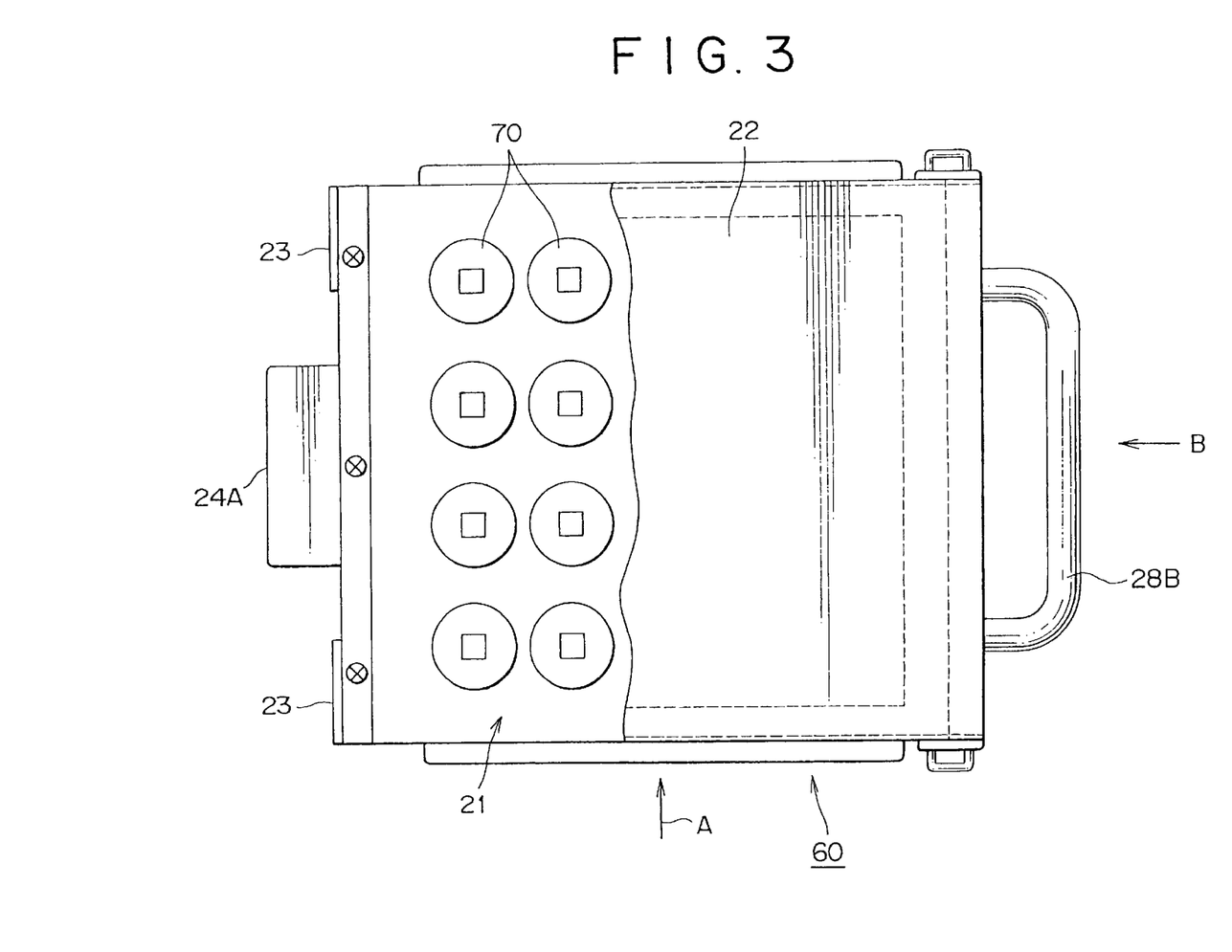
FIG. 3 is a top plan view showing the aging cassette shown in FIG. 2 with part of a lid member cut away.
Figure 6A:
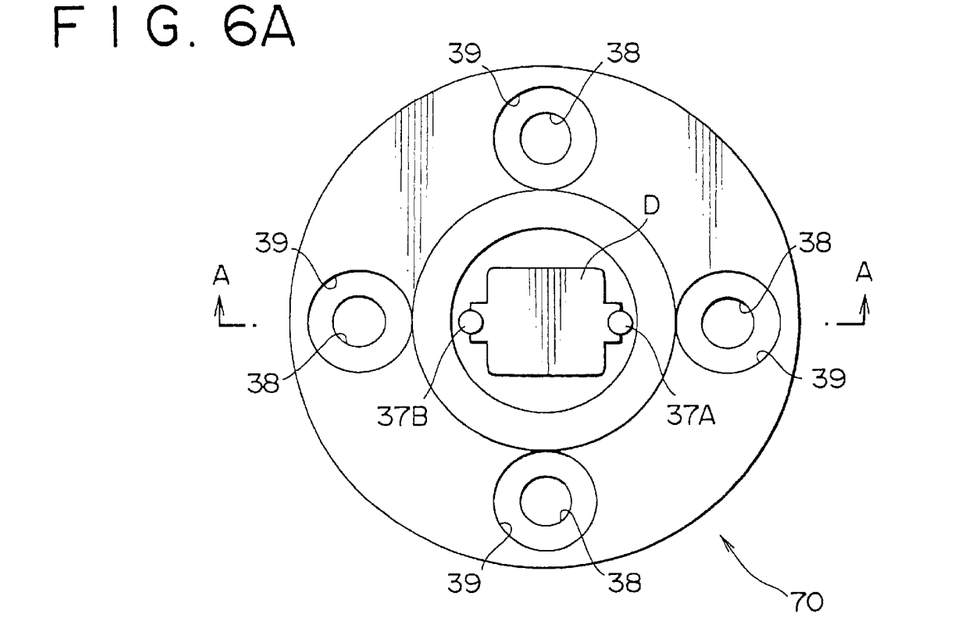
FIG. 6A is a top plan view showing a socket which is incorporated in the aging cassette shown in FIG. 2.
Figure 6B:
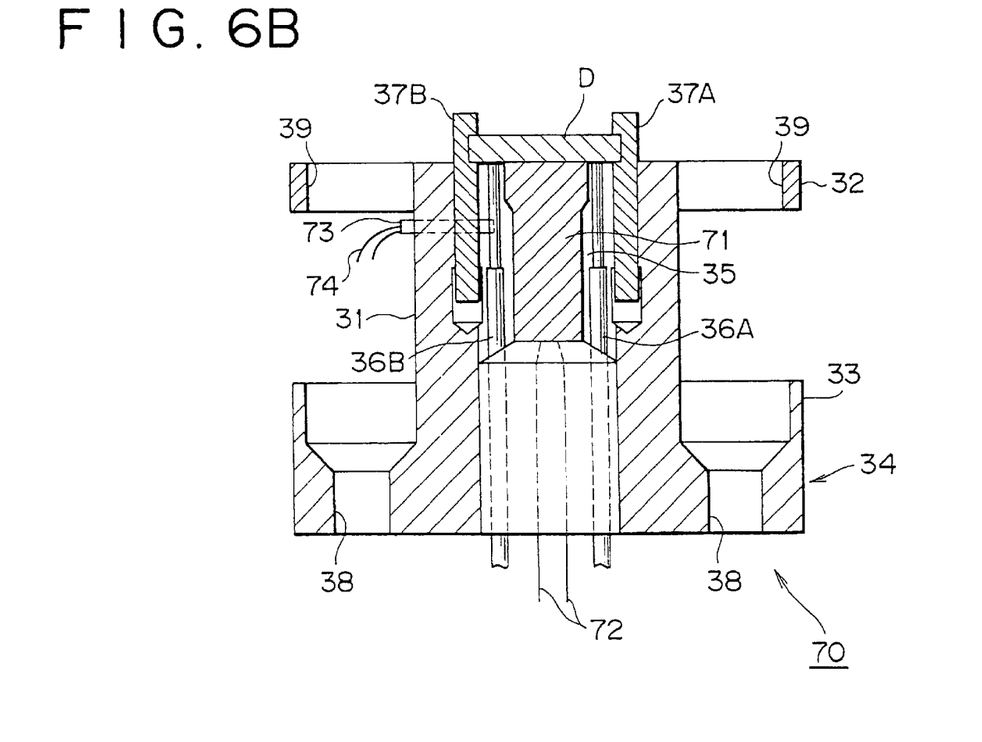
FIG. 6B is an enlarged sectional view taken along line A—A of FIG. 6A.

Referring first to FIG. 2, the cassette is generally denoted at 60. The cassette 60 is similar to but different from the conventional cassette 20 in individual sockets 70 thereof. Referring to FIGS. 6A and 6B, each socket 70 is similar to but different from the conventional socket 30 described hereinabove with reference to FIGS. 13A and 13B in that a heater 71 is incorporated in the hollow portion 35 of the base 34 of the socket 70 such that an end portion thereof is exposed to a coupler receiving portion of the socket 70 so as to contact with a semiconductor laser coupler D when the semiconductor laser coupler D is placed on the coupler receiving portion of the socket 70 and that a temperature sensor 73 is incorporated in the socket 70 such that it is opposed to the heater 71 in the proximity of the coupler receiving portion of the socket 70. For the heater 71, for example, a solid-state element which makes use of a Peltier effect is suitably used, and a pair of terminals 72 extend from the heater 71. Meanwhile, the temperature sensor 73 may be such an element as, for example, a thermocouple, and has a pair of terminals 74, for indicating the temperature of sensor 73.

While the temperature sensor 73 is preferably disposed as closely as possible to a heated semiconductor laser coupler D to detect the temperature of the semiconductor laser coupler D, if temperature correction is possible in advance, then the temperature sensor 73 may be disposed so as to detect the temperature of the coupler receiving portion or the temperature of the heater.

Figure 4:
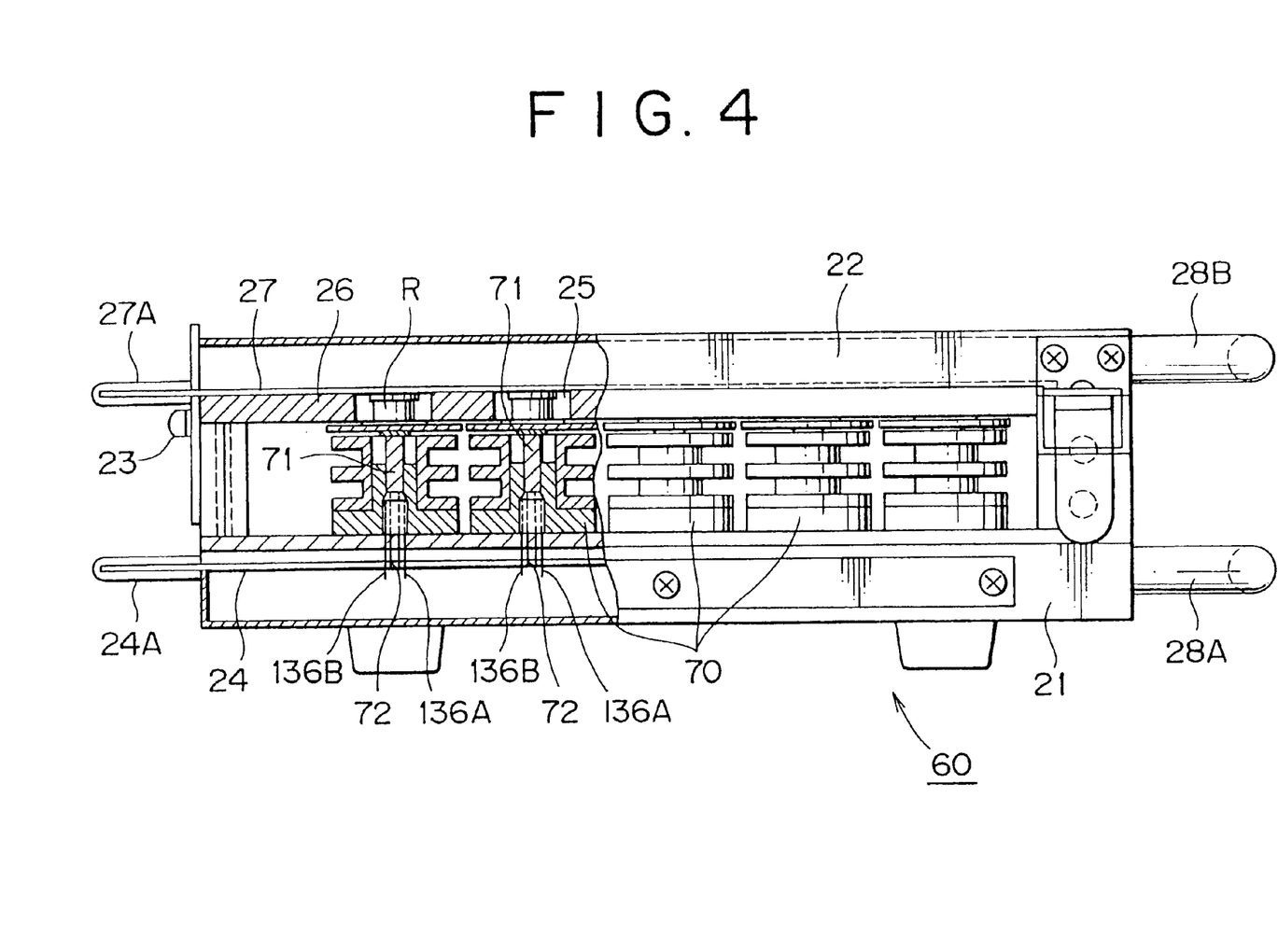
FIG. 4 is a schematic side elevational view partly in section showing a side face of the aging cassette shown in FIG. 3 as viewed from an arrow A.
Figure 5:
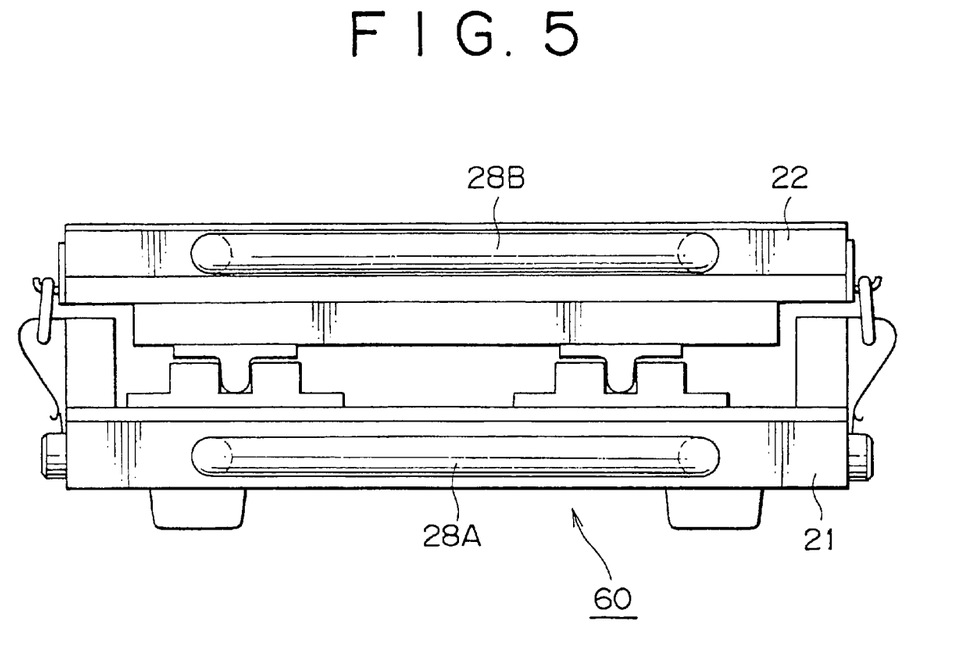
FIG. 5 is a side elevational view of the aging cassette shown in FIG. 3 as viewed from an arrow B.

A plurality of such sockets 70 are disposed in a matrix on a cassette shown in FIGS. 2 to 5 to which the present invention is applied. Particularly, as seen in FIG. 4 in which the cassette 60 is shown partly in section, the terminals 72 of the heaters 71 are connected to a power supply circuit (not shown) of the electronic circuit board 24 built in the body 21 of the cassette 60, and terminals 74 of the temperature sensors 73 are connected to a temperature control circuit (not shown) of the electronic circuit board 24. Also the other sockets 70 are connected similarly in parallel to each other.

A large number of such cassettes 60 on each of which a large number of semiconductor laser couplers D are mounted in such a manner as described above are inserted into the slots 12 of the aging apparatus 50 until the plug-in terminals 24A and 27A projecting from each of the cassettes 60 are inserted into the sockets (not shown) mounted in the interior of the slots 12 to mount the cassettes 60 in position into the aging apparatus 50. Then, the door not shown of the aging apparatus 50 is closed.

Then, the main power supply switch 57 and the individual power supply switches 53 of the aging apparatus 50 are turned on, and the semiconductor laser couplers D mounted on the sockets 70 in the individual cassettes 60 are controlled by the temperature regulators 54 through the temperature sensors 73 so that they may be kept at a predetermined fixed temperature.

Simultaneously, power is supplied to the semiconductor laser couplers D through the plug-in terminals 24A while power is simultaneously supplied also to the light receiving elements R corresponding to the individual semiconductor laser couplers D through the plug-in terminals 27A. Then, data signals produced by the light receiving elements R receiving laser beams generated from the corresponding semiconductor laser couplers D are inputted from the plug-in terminals 27A to a computer (not shown) connected to the aging apparatus 50. The computer processes the data signals to detect and record characteristic variations of the semiconductor laser couplers D and so forth. The data are also displayed on the individual monitors 55.

Such aging as described above is performed to investigate whether or not the individual semiconductor laser couplers D are good or whether or not semiconductor laser couplers D are good for each manufacture lot.

The main power supply switch 57 need not necessarily be provided. In this instance, a power supply circuit may be provided by which, when the power supply switches 53 provided for the individual slots 52 are turned on, the semiconductor laser couplers D mounted on the individual sockets 70 in the slots 52 are heated by the heaters 71.

Alternatively, such a power supply circuit that, when it is desired to mount the cassettes 60 into the slots 52 and perform aging, only if the main power supply switch 57 is turned on, all of the sockets 70 are energized to cause the heaters 71 to generate heat may be provided.

When aging of semiconductor laser couplers D described above is performed using a cassette 60 and the aging apparatus 50, the cassette 60 need not be mounted in all of the slots 52 of the aging apparatus 50. Since a heater 71 is incorporated in each of the sockets 70, if one cassette 60 is mounted into one of the slots 52 and the power supply switch 53 provided for the slot 52 is turned on, then aging of semiconductor laser couplers D of the single cassette 60 can be performed.

Further, since a heater 71 is incorporated in each of the sockets 70, even if the semiconductor laser coupler D as aging object parts is not mounted in all of the sockets 70 in one cassette 60, or in an extreme case, even if only one semiconductor laser coupler D is mounted in one cassette 60, it is possible to mount the cassette 60 into a slot 52 of the aging apparatus 50 and turn on the power supply switch 53 provided for the slot 52 to perform aging of the single semiconductor laser coupler D.

While, in the foregoing description, a semiconductor laser coupler is used as an aging object part, the aging object part is not limited to this, and the present invention can naturally be applied also to aging of a semiconductor device such as an ordinary IC, or some other electronic part or mechanical part.

While a preferred embodiment of the present invention has been described using specific terms, such description is for illustrative purposes only, and it is to be understood that changes and variations may be made without departing from the spirit or scope of the following claims.

What is claimed is:

1. An aging socket, comprising:
    a base having a mounting portion on which an aging object part can be mounted, said base defining a hollow portion;
    a heater disposed in said hollow portion for heating an aging object part mounted on said mounting portion, an end portion of said heater being exposed to and in contact with said aging object part when mounted on said mounting portion;
    a temperature sensor located in said hollow portion for detecting a temperature of said mounting portion, a temperature of an aging object part mounted on said mounting portion and being heated or a temperature of said heater;
    said heater and said temperature sensor being incorporated in said base in such a manner as to be opposed to said mounting portion; and
    a temperature indicator incorporated in said base for indicating the temperature of said sensor.

2. An aging socket as claimed in claim 1, wherein said heater is a solid-state element which makes use of a Peltier effect.

3. An aging socket as claimed in claim 1, wherein said temperature sensor is a thermocouple having a pair of terminals for indicating the temperature of said sensor.

4. A cassette having a plurality of aging sockets as claimed in claim 1, said cassette having a matrix for receiving said plurality of said aging sockets, wherein terminals of said plurality of said heaters are connected to a power supply of an electronic circuit board built in the body of the cassette 60.

5. A cassette as set forth in claim 4 wherein terminals of said plurality of temperature sensors are connected to a temperature control circuit of said electronic circuit board.

6. An aging socket as set forth in claim 1 wherein said aging object part is a semiconductor laser coupler.

7. An aging cassette, comprising:
    a body;
    a plurality of sockets disposed on said body and each including a base including a mounting portion on which an aging object part can be mounted, a heater for heating an aging object part mounted on said mounting portion, and a temperature sensor for detecting a temperature of said mounting portion, a temperature of an aging object part mounted on said mounting portion and being heated or a temperature of said heater, said heater and said temperature sensor being incorporated in said base in such a manner as to be opposed to said mounting portion; and
    an electronic circuit board built in said body and including a power supply circuit by which terminals of the heaters and the temperature sensors mounted on said sockets are connected to individual power supplies.

8. An aging cassette as set forth in claim 7, wherein said aging object part is a semiconductor laser coupler.

9. An aging cassette as set forth in claim 7, wherein said temperature sensor and said terminals of the temperatures sensors together constitute a temperature indicator for indicating the temperature of the temperature sensor.

10. An aging cassette as set forth in claim 7 wherein said base defines a hollow portion, and said heater and said temperature sensor each are located in said hollow portion.

11. An aging apparatus, comprising:

a body on which a plurality of slots each capable of receiving an aging cassette are formed, each of the aging cassettes including a body;

a plurality of sockets disposed on said body and each including a body, a plurality of sockets disposed on said body of the socket and each including a base on which a mounting portion on which an aging object part can be mounted is formed, a heater for heating an aging object part mounted on said mounting portion, and a temperature sensor for detecting a temperature of said mounting portion, a temperature of an aging object part mounted on said mounting portion and being heated or a temperature of said heater, said heater and said temperature sensor being incorporated in said base in such a manner as to be opposed to said mounting portion, and an electronic circuit board built in said body and including a power supply circuit by which terminals of the heaters and the temperature sensors mounted on said sockets are connected to individual power supplies; and a start switch and a temperature regulator incorporated in each of said slots; and further comprising a temperature indicator incorporated in each of said slots.

12. An aging apparatus as set forth in claim 11 wherein said aging object part is a semiconductor laser coupler.

13. An aging apparatus as set forth in claim 11, wherein said body of each of said sockets defines a hollow portion, and said heater and said temperature sensor each are located in said hollow portion.

* * * * *